(12) United States Patent
Onizawa

(10) Patent No.: US 8,551,842 B2
(45) Date of Patent: Oct. 8, 2013

(54) METHOD OF MANUFACTURING SEMICONDUCTOR DEVICE

(75) Inventor: Takashi Onizawa, Ibaraki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 590 days.

(21) Appl. No.: 12/801,208

(22) Filed: May 27, 2010

(65) Prior Publication Data

US 2010/0317200 A1 Dec. 16, 2010

(30) Foreign Application Priority Data

Jun. 12, 2009 (JP) .................................. 2009-141190

(51) Int. Cl.
   *H01L 21/336* (2006.01)
   *H01L 21/477* (2006.01)
   *H01L 21/324* (2006.01)

(52) U.S. Cl.
   CPC .................................. *H01L 21/324* (2013.01)
   USPC ........... 438/287; 438/305; 438/530; 438/591; 438/595; 257/E21.435

(58) Field of Classification Search
   USPC .......................... 438/287, 305, 530, 591, 595; 257/E21.435
   See application file for complete search history.

(56) References Cited

U.S. PATENT DOCUMENTS

| 7,238,982 B2 | 7/2007 | Chung |
| 7,279,405 B2 * | 10/2007 | Itani et al. ..................... 438/530 |
| 7,410,871 B2 | 8/2008 | Chung |
| 2005/0281125 A1 | 12/2005 | Chung |
| 2007/0218632 A1 | 9/2007 | Chung |

FOREIGN PATENT DOCUMENTS

| JP | 55067132 A * | 5/1980 |
| JP | 2006-5357 A | 1/2006 |

OTHER PUBLICATIONS

T. Yamamoto et al., "Advantages of a New Scheme of Junction Profile Engineering with Laser Spike Annealing and Its Integration into a 45-nm Node High Performance CMOS Technology," VLSI Technology Digest of Technical Papers, p. 122-123, 2007.

* cited by examiner

*Primary Examiner* — Zandra Smith
*Assistant Examiner* — Toniae Thomas
(74) *Attorney, Agent, or Firm* — McGinn IP Law Group, PLLC

(57) ABSTRACT

A method of manufacturing a semiconductor device includes performing heat treatment for activating impurities of a transistor having a gate electrode over a gate insulating film with a higher relative permittivity than a silicon oxynitride film or a silicon oxide film. In the heat treatment, a first heat treatment, in which a wafer surface is heated at a temperature of 800 to 1000° C. in 5 to 50 milliseconds by low-output flash lamp annealing or laser annealing, and a second heat treatment, in which the wafer surface is heated at a temperature equal to or more than of 1100° C. in 0.1 to 10 milliseconds by flash lamp annealing or laser annealing with a higher output than in the first heat treatment, are performed in this order.

7 Claims, 9 Drawing Sheets

METHOD OF MANUFACTURING SEMICONDUCTOR DEVICE

This application is based on Japanese patent application No. 2009-141190, the content of which is incorporated hereinto by reference.

BACKGROUND

1. Technical Field

The present invention relates to a method of manufacturing a semiconductor device.

2. Related Art

As semiconductor devices become miniaturized, a junction (diffusion layer) which is shallower and has lower resistance than before is demanded in the source/drain (SD) extension portion. In order to form a junction which is shallower and has lower resistance, it is necessary to perform heat treatment at a high temperature within a short time. However, it is difficult to meet the demand with spike rapid thermal annealing (sRTA) which is generally used.

sRTA is a heat treatment technique using lamp light. In sRTA, the holding time at peak temperature is about 0 seconds, but the wafer temperature is maintained at "peak temperature −50° C." or more for 1 second, for example.

Then, as next-generation techniques of sRTA, techniques of heating the silicon wafer surface at 1100° C. or more on the order of milliseconds, such as Flash Lamp Annealing (hereinafter, referred to as "FLA") and Laser Annealing (hereinafter, referred to as "LA"), are expected.

Currently, various kinds of proposals have been made as the millisecond-order annealing techniques described above (for example, refer to Japanese Laid-open Patent Publication NO. 2006-005357 and "T. Yamamoto et al., VLSI Symp. Tech., p122, 2007".

The present inventor has recognized as follows. In such millisecond-order annealing, however, there is a problem that defects (especially, an amorphous layer used for SD extension formation of a pFET) caused at the time of ion implantation cannot be recovered since the heat treatment time is too short.

Although a process in which FLA and sRTA are combined has been reported to accelerate the recovery of defects, it has a disadvantage in that the limitation of a shallow junction is defined by sRTA. On the other hand, when an amorphous layer is not formed in the pFET, there is a disadvantage in that the activation rate drops.

In recent years, a technique of making the silicon surface amorphous before implanting SD extension impurities of the pFET is used. This is a technique of ion-implanting silicon or impurities (for example, Ge) with a larger atomic weight than silicon to the silicon surface in order to prevent channeling and also has an effect of increasing the absorption coefficient of the surface layer.

However, there are trade-offs between this technique and the effect of millisecond annealing. While it has been reported that the activation rate increases when an amorphous layer is formed at a silicon surface, many crystal defects remain in the silicon. Accordingly, there was a high possibility that problems, such as a junction leakage current, would be generated since the defects could not be recovered by only normal millisecond annealing.

SUMMARY

In one embodiment, there is provided a method of manufacturing a semiconductor device including performing heat treatment for activating impurities of a transistor having a gate electrode over a gate insulating film with a higher relative permittivity than a silicon oxynitride film or a silicon oxide film. In the heat treatment, a first heat treatment, in which a wafer surface is heated at a temperature of 800 to 1000° C. in 5 to 50 milliseconds by low-output flash lamp annealing or laser annealing, and a second heat treatment, in which the wafer surface is heated at a temperature equal to or more than 1100° C. in 0.1 to 10 milliseconds by flash lamp annealing or laser annealing with a higher output than in the first heat treatment, are performed in this order.

In the method of manufacturing a semiconductor device according to the embodiment of the present invention, the wafer surface is heated at a high temperature of 800 to 1000° C. in 5 to 50 milliseconds by preheating before performing high-output flash lamp annealing or laser annealing in which the wafer surface is heated at a temperature equal to or more than 1100° C. in 0.1 to 10 milliseconds. By performing such preheating, diffusion of impurities can be suppressed. Moreover, since a semiconductor surface where an amorphous layer is not formed can be effectively activated, it is possible to form a junction (diffusion layer) which has few defects, is shallow, and has low resistance.

According to the present invention, it is possible to form a junction (diffusion layer) which has few defects, is shallow, and has low resistance.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
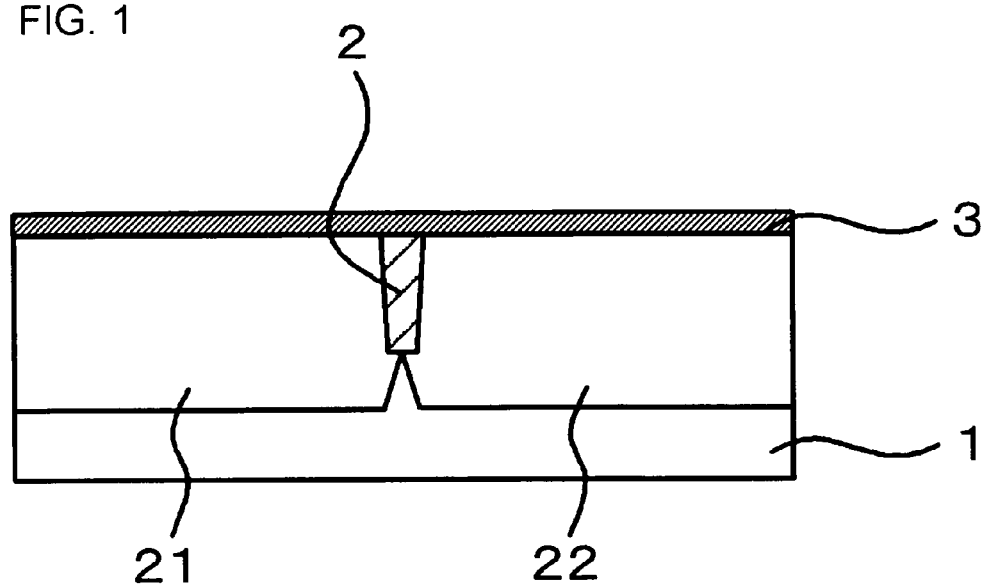
FIG. 1 is a schematic sectional view showing a first procedure in a method of manufacturing a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Embodiments of the present invention will be explained below, referring to the attached drawings. Note that any similar constituents will be given the same reference numerals or symbols in all drawings, and explanations therefor will not be repeated.

A method of manufacturing a semiconductor device according to the present embodiment includes a procedure of performing a heat treatment for activating impurities of a transistor having a gate electrode (a polysilicon gate electrode or a metal gate electrode) over a gate insulating film with a higher relative permittivity than a silicon oxynitride film or a silicon oxide film. In this heat treatment, a first heat treatment and a second heat treatment are performed in this order. In the first heat treatment, a wafer surface is heated at a temperature of 800 to 1000° C. in 5 to 50 milliseconds by low-output flash lamp annealing or laser annealing. In the second heat treatment, the wafer surface is heated at a temperature equal to or more than 1100° C. in 0.1 to 10 milliseconds by flash lamp annealing or laser annealing with a higher output than in the first heat treatment. Now, a detailed explanation thereof will be given.

More specifically, as shown in FIG. 1, an HfSiON film is formed by vapor-depositing an HfSiO film 3, which is a high-permittivity insulating film, over an n-type well 22 and a p-type well 21, which are formed in a semiconductor substrate 1 isolated by an element isolation region 2, with a silicon oxide film as an interfacial layer therebetween and performing a high temperature treatment in the nitrogen atmosphere, for example.

In this case, the dielectric film may be a predetermined insulating film (a material of this insulating film is at least one dielectric material selected from the group consisting of $SiO_2$, $HfO_2$, $HfSiO_x$, $HfAlO_x$, $ZrO_2$, $ZrSiO_x$, $ZrAlO_x$, $Y_2O_3$, $La_2O_3$, $MgO_2$, $Al_2O_3$, and nitrides thereof; x is an arbitrary positive number).

Here, $HfSiO_x$ is in a state in which $HfO_2$ and $SiO_2$ are dissolved as solid solutions. Since $HfO_2$ and $SiO_2$ can be dissolved as complete solid solutions, the ratio of solid solutions is controlled according to the purpose. If the ratio of Hf+Si and O is about 2, the value of (Hf+Si)/O can be set to about 2 by a subsequent heat treatment.

$HfAlO_x$ is in a state in which $HfO_2$ and $Al_2O_3$ are dissolved as solid solutions, and the ratio of $HfO_2$ and $Al_2O_3$ is controlled according to the purpose by subsequent heat treatment. The same is true for $ZrSiO_x$ and $ZrAlO_x$.

Figure 2:
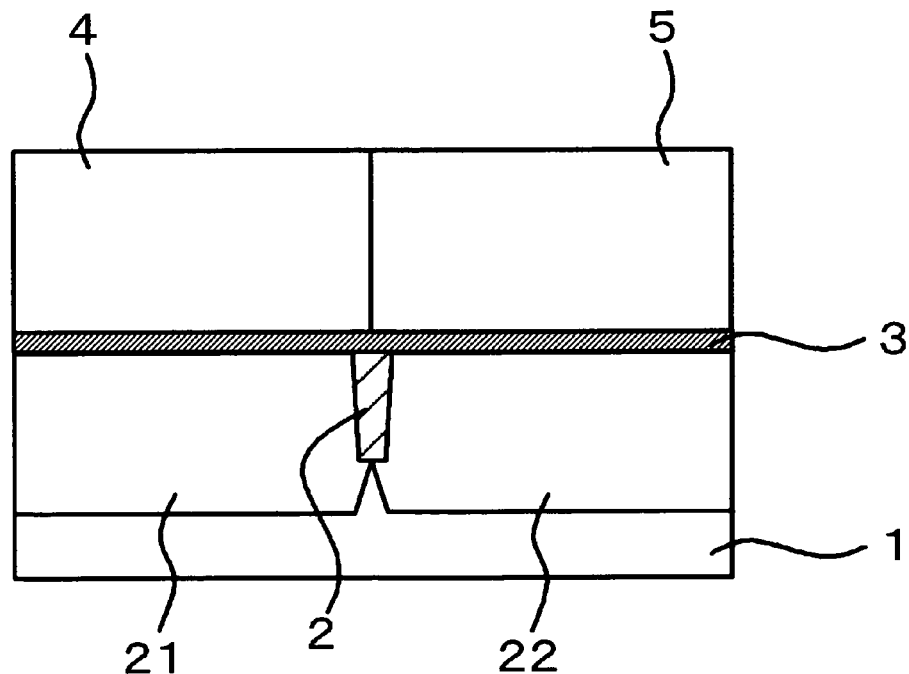
FIG. 2 is a schematic sectional view showing a second procedure in the method of manufacturing a semiconductor device according to the embodiment.

Then, metal gate electrodes having threshold values approximately suitable for an nMOS and a pMOS, respectively, are formed. For example, as shown in FIG. 2, TaSiN 4 and TiN 5 are formed as the metal gate electrodes, respectively.

Figure 3:
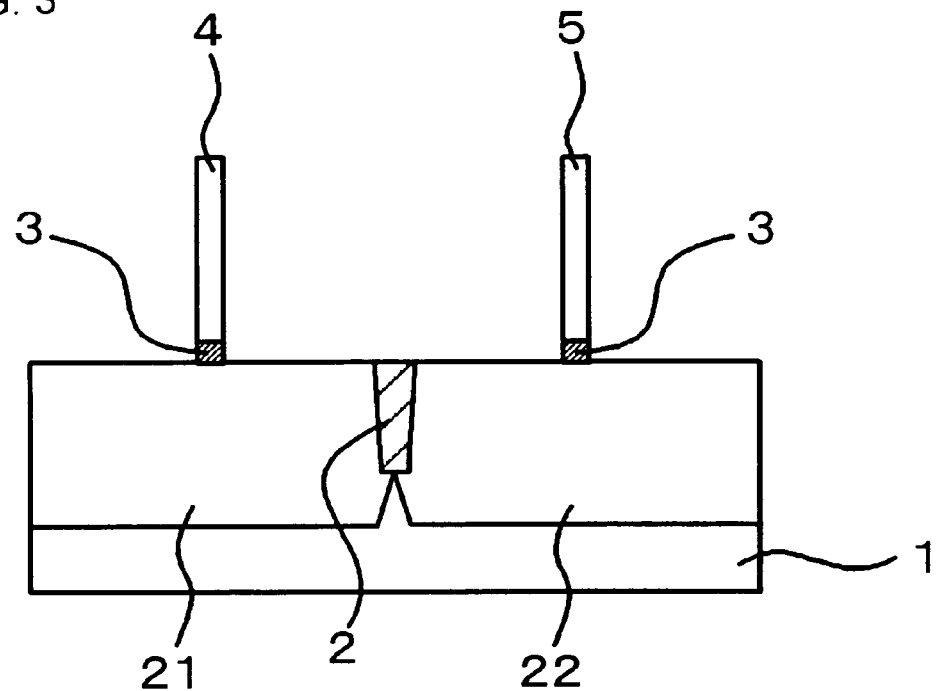
FIG. 3 is a schematic sectional view showing a third procedure in the method of manufacturing a semiconductor device according to the embodiment.

In this case, the metal material may be a predetermined electrode material (this material is at least one conductive material selected from the group consisting of Poly-Si, Ta, $TaSi_x$, $TaC_x$, Ti, $TiSi_x$, $TiC_x$, Hf, $HfSi_x$, $HfC_x$, Mo, $MoSi_x$, $MoC_x$, $TaN_x$, W, $WSi_x$, $WC_x$, Zr, $ZrSi_x$, $ZrC_x$, and nitrides thereof; x is an arbitrary positive number). Then, a gate stack is formed (not shown in the drawings) and then gate patterning (FIG. 3) is performed.

Although the composition of the metal material may be changed according to the purpose, $TaSi_2$, TaC, $TiSi_2$, TiC, HfSi, HfC, $MoSi_x$, MoC, TaN, $WSi_2$, WC, ZrSi, and ZrC are usually used from a point of view of stability.

Figure 4:
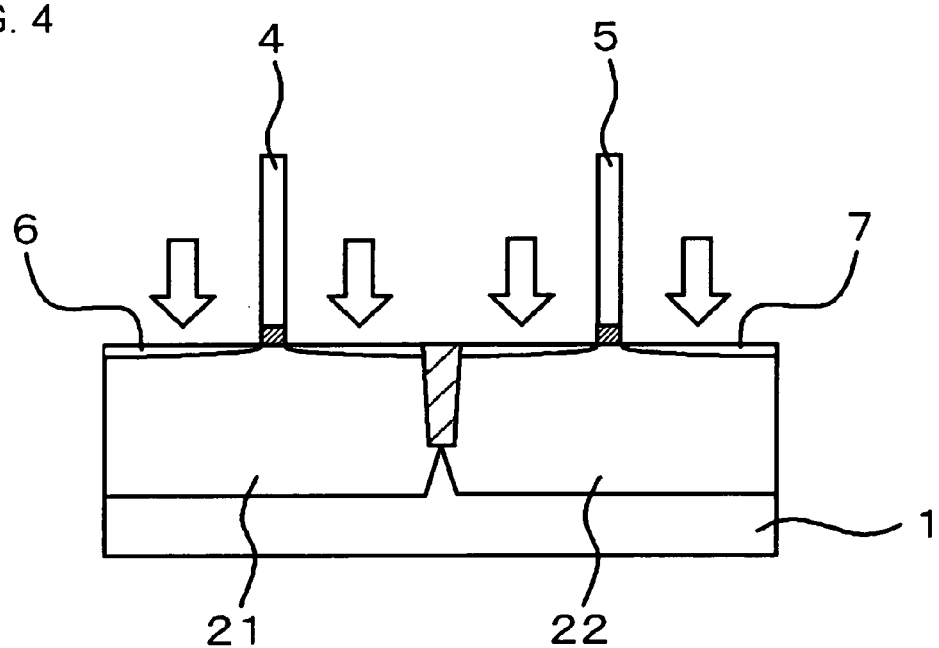
FIG. 4 is a schematic sectional view showing a fourth procedure in the method of manufacturing a semiconductor device according to the embodiment.

Then, SD extension implantation and pocket implantation are performed for a pFET and an nFET, respectively. For example, as shown in FIG. 4, As is ion-implanted with low energy in an SD extension region 6 of the nFET, and boron is ion-implanted with low energy in an SD extension region 7 of the pFET. In this case, since implantation of Ge, Si, and the like is not performed, an amorphous layer is not formed in the SD extension region 7. That is, silicon in the SD extension region 7 is not made amorphous at the time of SD extension implantation.

Figure 5:
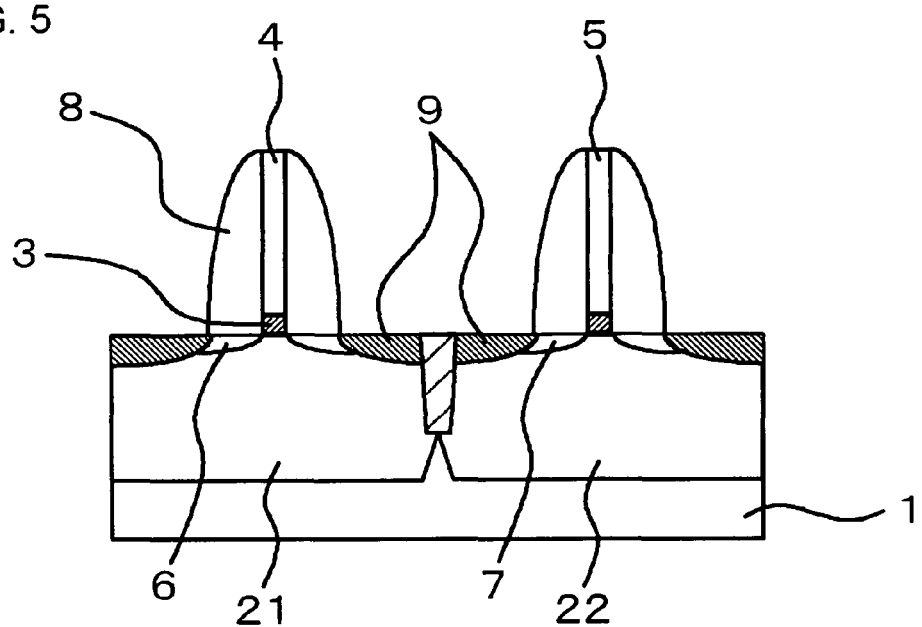
FIG. 5 is a schematic sectional view showing a fifth procedure in the method of manufacturing a semiconductor device according to the embodiment.
Figure 6:
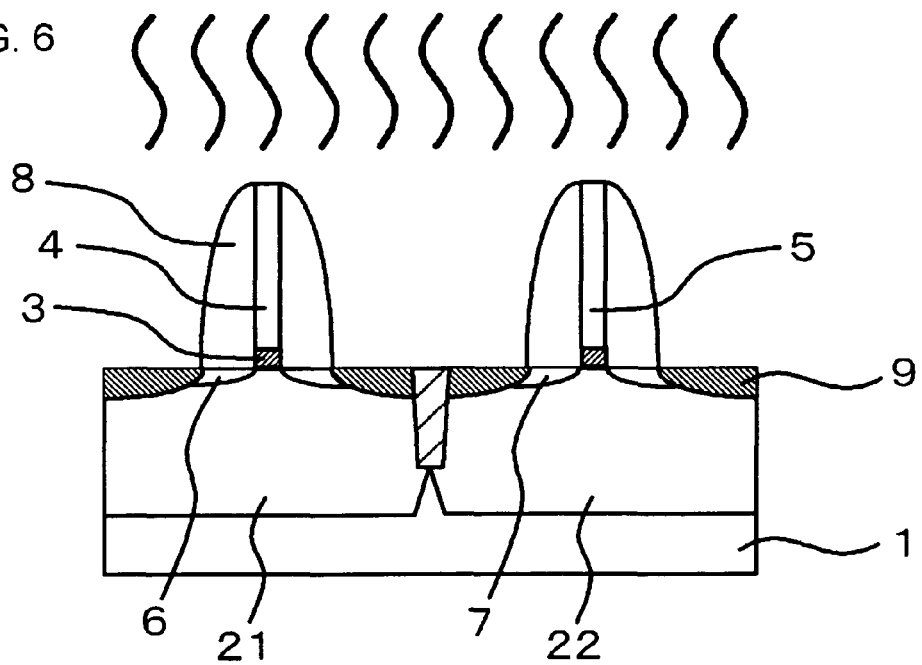
FIG. 6 is a schematic sectional view showing a sixth procedure in the method of manufacturing a semiconductor device according to the embodiment.

Then, a source/drain region 9 is formed by formation of a sidewall 8 and Deep SD ion implantation (FIG. 5). Activation of impurities is performed using FLA in which a low-output waveform and a high-output waveform are combined (FIG. 6). That is, the first heat treatment, in which the wafer surface is heated at a temperature of 800 to 1000° C. in 5 to 50 milliseconds by low-output flash lamp annealing, and the second heat treatment, in which the wafer surface is heated at a temperature of 1100° C. or more in 0.1 to 10 milliseconds by high-output flash lamp annealing, are performed in this order. In addition, it is preferable to perform the second heat treatment subsequent to the first heat treatment.

Figure 7:
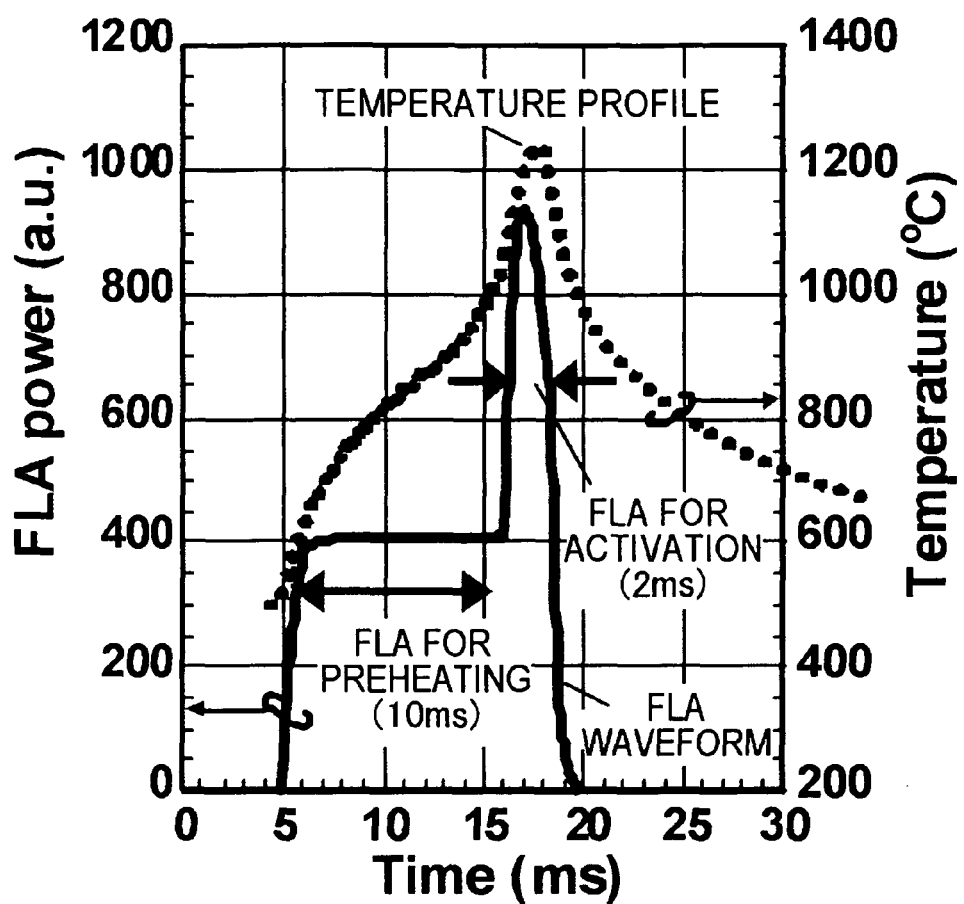
FIG. 7 is a view explaining the embodiment, and is a view showing the relationship between a power profile (relationship between power supplied to a lamp and time) when preheating is performed by FLA and then high-temperature FLA is performed and the wafer surface temperature calculated by simulation.

The waveform and a temperature profile based on simulation are shown in FIG. 7. FIG. 7 shows the relationship between a power profile (FLA waveform) when preheating is performed by FLA and the wafer surface temperature calculated by simulation.

A simulation result is obtained in which the wafer surface temperature rises gradually at the time of preheating and rises to 900° C. immediately before FLA for activation is performed. Before FLA for activation (temperature is equal to or more than 1100° C. and energy supply time is 2 ms), FLA for wafer preheating (energy supply time is 10 ms) was performed.

Figure 8:
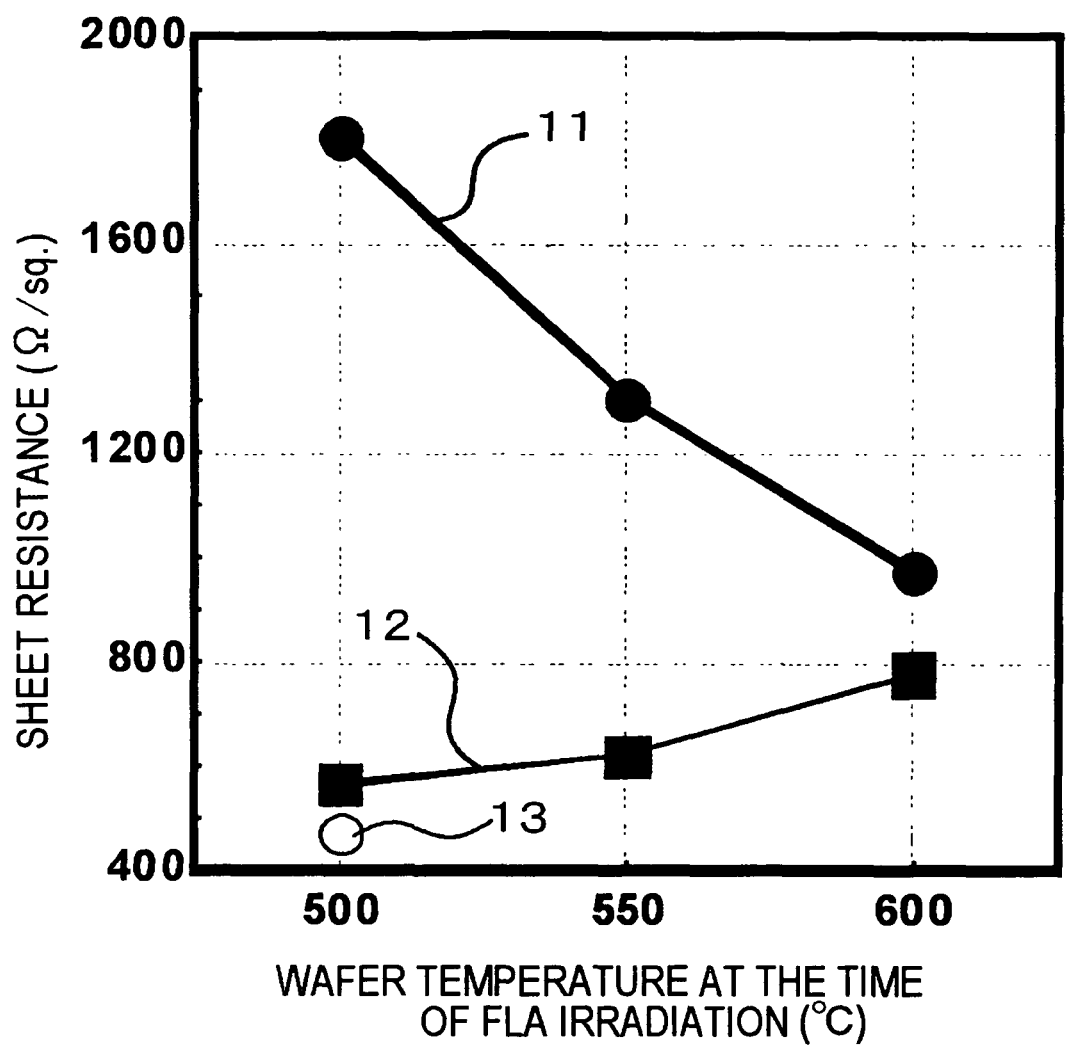
FIG. 8 is a view showing the comparison of the sheet resistance when an amorphous layer is formed beforehand at a silicon wafer surface and the sheet resistance when the amorphous layer is not formed.

FIG. 8 shows the sheet resistance (Rs) of a $p^+$diffusion layer when activation using FLA was performed after implanting boron ions ($10^{15}/cm^2$) at 0.5 keV in a case where a preamorphous layer is formed in a silicon wafer and a case where a preamorphous layer is not formed in a silicon wafer. In FIG. 8, the horizontal axis indicates a static stage temperature. A black circle (●) and a black square (■) each show a result obtained by performing FLA for activation while changing the stage temperature.

In the case where an amorphous layer is not formed (reference numeral 11), it can be seen that the sheet resistance decreases as the preannealing temperature rises. On the other hand, in the case where an amorphous layer is formed (reference numeral 12), it can be seen that the sheet-resistance increases as the preannealing temperature rises. In the case where an amorphous layer is formed (reference numeral 12), it is thought that the amorphous layer recovered slightly and heat absorption decreased accordingly. On the other hand, in the case where an amorphous layer is not formed (reference numeral 11), it is thought that an effect appeared in which absorption of light increased due to a rise in temperature and the heating temperature rose accordingly.

The energy irradiation time of high-intensity FLA for which the temperature (simulation temperature) of a wafer surface exceeds 1100° C. is equal to or less than 1 ms, and the wafer temperature before the irradiation is 500, 550, and 600° C.

In the case where the amorphous layer is formed (reference numeral 12), the sheet resistance increases with a rise in the wafer temperature. This is because effective activation is not performed since crystal recovery of the amorphous layer is realized before high-intensity flash lamp irradiation as the wafer temperature rises.

On the other hand, in the case where the amorphous layer is not formed (reference numeral 11), the sheet resistance decreases with a rise in the wafer temperature. This is because the sheet resistance depends only on the attained temperature at the time of high-intensity flash lamp irradiation (if the temperature before irradiation is high, the attained temperature also becomes high) in this case. However, even in flash irradiation at the wafer temperature of 600° C., the sheet resistance does not increase compared with the case where the amorphous layer is formed.

A further decrease in the sheet resistance may be expected by further increasing the wafer temperature. However, since pre-annealing before general FLA irradiation is a heat treatment for 1 second or more, there is a concern about diffusion of impurities during that time.

Therefore, as shown in FIG. 7, by increasing the wafer surface temperature with a low-output flash for about 5 to 50 milliseconds before high-output FLA, high activation was performed while preventing the diffusion of impurities (there is no amorphous layer formed). This level is indicated by reference numeral 13 in FIG. 8.

By performing high-output FLA after performing preheating FLA, it is possible to form a low-resistance junction like a white circle (○) indicated by the reference numeral 13 in FIG. 8, compared with an SD extension formed in each of the cases where an amorphous layer is formed beforehand using FLA, in which a time for which the wafer surface temperature is held at 1000° C. or more is 100 milliseconds or less, and the case where the amorphous layer is not formed. In this case, the stage temperature is 500° C.

Figure 9:
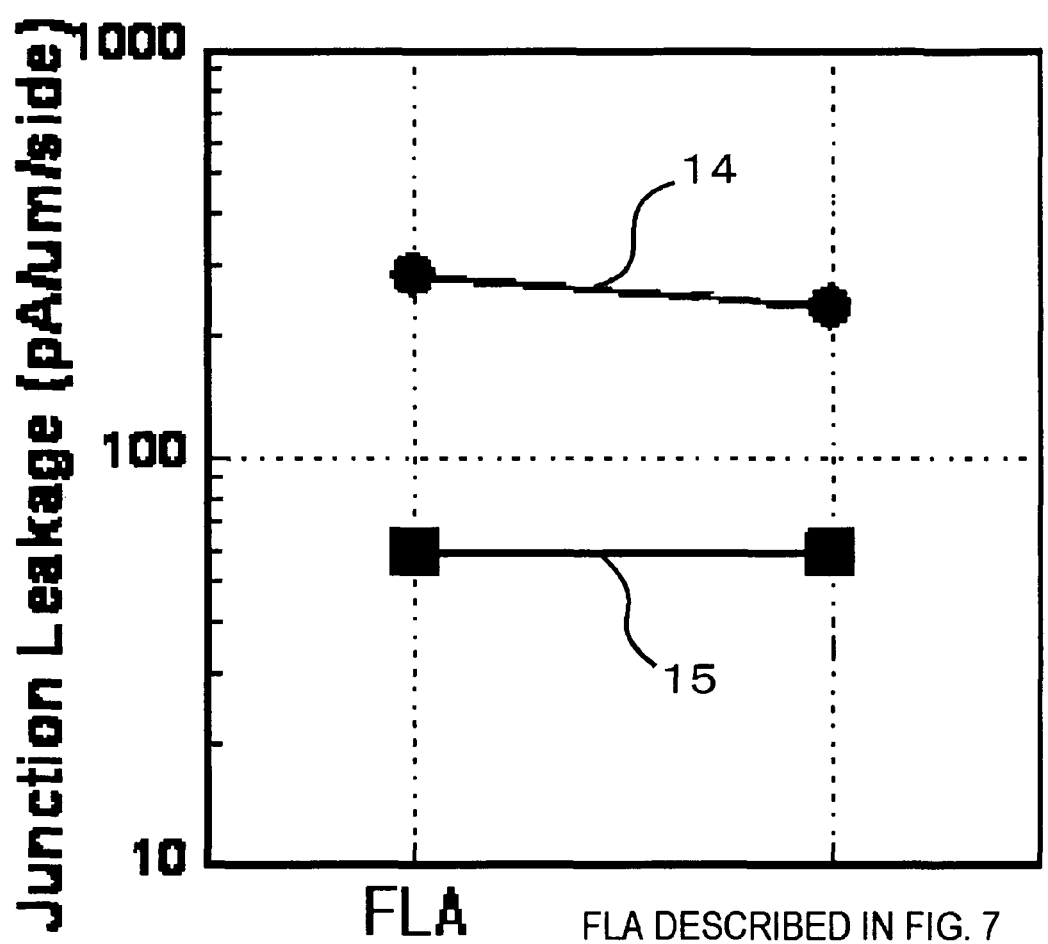
FIG. 9 is a characteristic view showing a junction leakage current of an nFET when an amorphous layer is formed beforehand at a silicon wafer surface and a junction leakage current of the nFET when the amorphous layer is not formed.

In addition, FIG. 9 shows a junction leakage current of an nFET depending on the existence of an amorphous layer. In the case where the amorphous layer is not formed when forming an SD extension of a pFET (reference numeral 15), the junction leakage current of the device can be reduced by about one order of magnitude as shown in FIG. 9, compared with the case where the amorphous layer is formed when forming the SD extension of the pFET (reference numeral 14).

As described above, in the method of manufacturing a semiconductor device according to the present embodiment, when performing high-intensity FLA for the semiconductor substrate 1, which is a silicon wafer, in order to heat the wafer surface at a temperature equal to or more than 1100° C. in 0.1 to 10 milliseconds, the wafer surface temperature immediately before the high-intensity FLA is set to a high temperature of 800 to 1000° C.

Diffusion of impurities is suppressed by preheat the wafer by flash with an adjusted waveform. Since FLA can be performed in such a temperature profile, abrupt heat stress at the time of FLA for activation is reduced.

Accordingly, the SD extension resistance can be significantly reduced without the wafer breaking even if FLA for activation is performed at higher temperature. Since a semiconductor layer of a surface where an amorphous layer is not formed can be effectively activated using this technique, it is possible to form a junction (diffusion layer) which has few defects, is shallow, and has low resistance.

In addition, the present invention is not limited to the present embodiment and various modifications are allowed within the range without departing from the subject matter. For example, in the above embodiment, the case was described in which the SD extension region surface was not made amorphous by implantation of Ge, Si, or the like when ion-implanting As with low energy in the SD extension region 6 of the nFET and ion-implanting monatomic boron with low energy in the SD extension region 7 of the pFET as shown in FIG. 4, the source/drain region 9 was formed by formation of the sidewall 8 and Deep SD ion implantation as shown in FIG. 5, and activation of impurities was performed using FLA in which a low-output waveform and a high-output waveform were combined as shown in FIG. 6.

Figure 10:
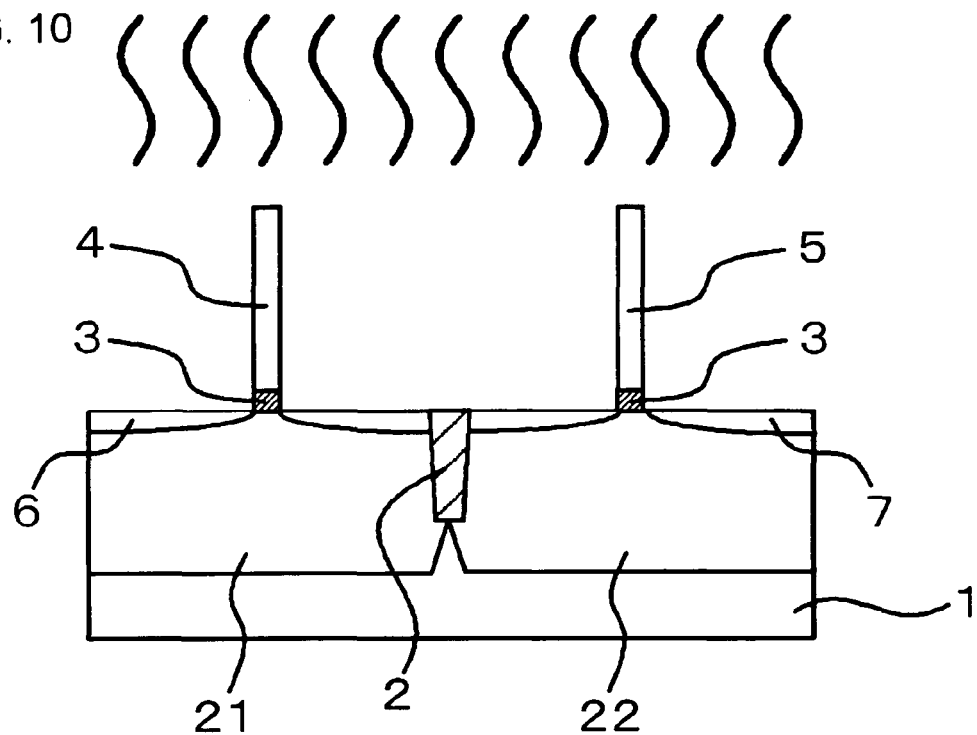
FIG. 10 is a schematic sectional view showing a fifth procedure in a first modification.

However, as shown in FIG. 10, FLA in which a low-output waveform and a high-output waveform are combined may be performed after performing SD extension implantation and pocket implantation for a pFET and an nFET, respectively.

Figure 11:
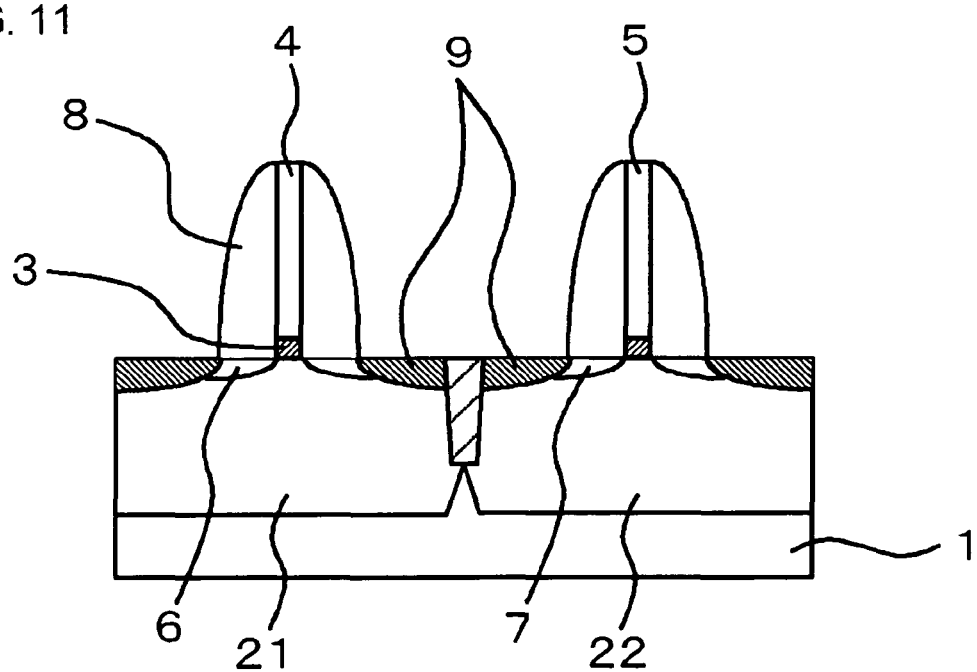
FIG. 11 is a schematic sectional view showing a sixth procedure in the first modification.
Figure 12:
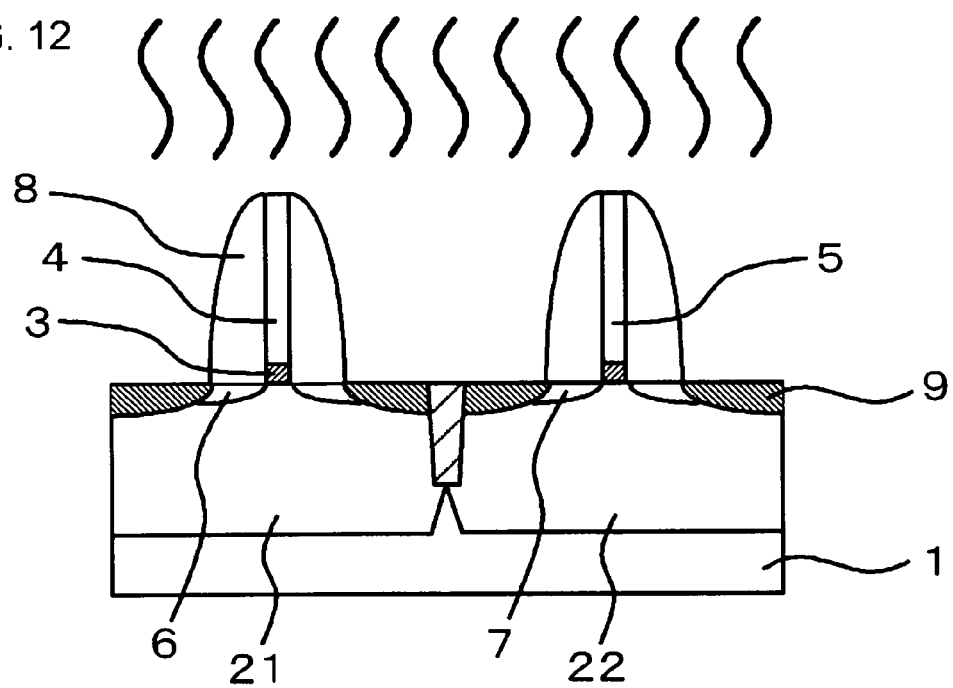
FIG. 12 is a schematic sectional view showing a seventh procedure in the first modification.

In this case, as shown in FIG. 11, the source/drain region 9 is formed thereafter by formation of the sidewall 8 and Deep SD ion implantation. Moreover, as shown in FIG. 12, activation of impurities may also be performed by flash lamp annealing in which the time for which the wafer surface temperature exceeds 1000° C. is 0.1 to 10 milliseconds.

Figure 13:
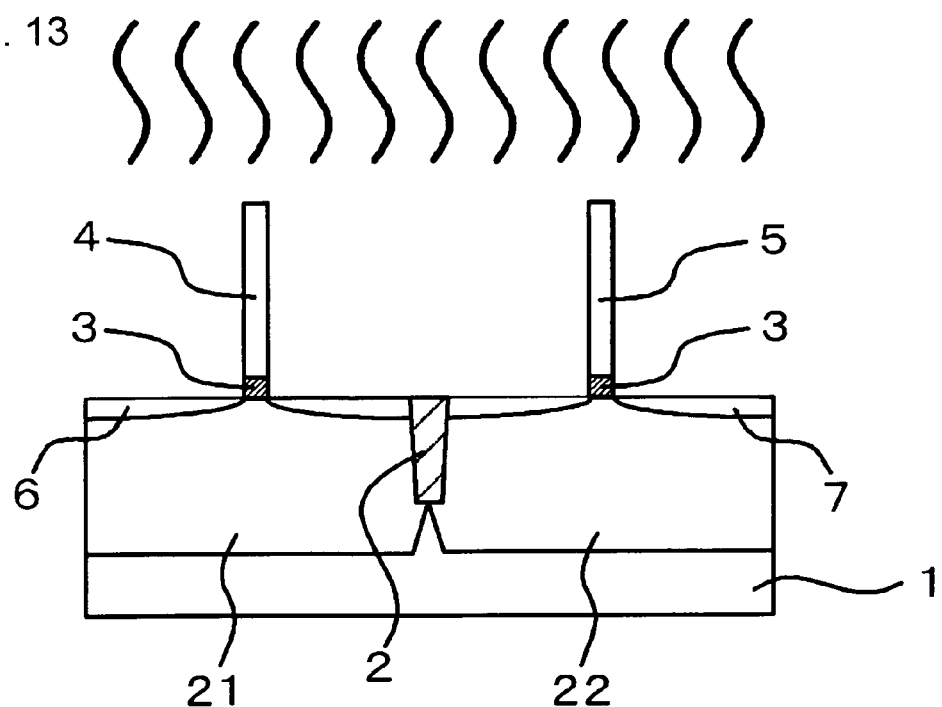
FIG. 13 is a schematic sectional view showing a fifth procedure in another modification.
Figure 14:
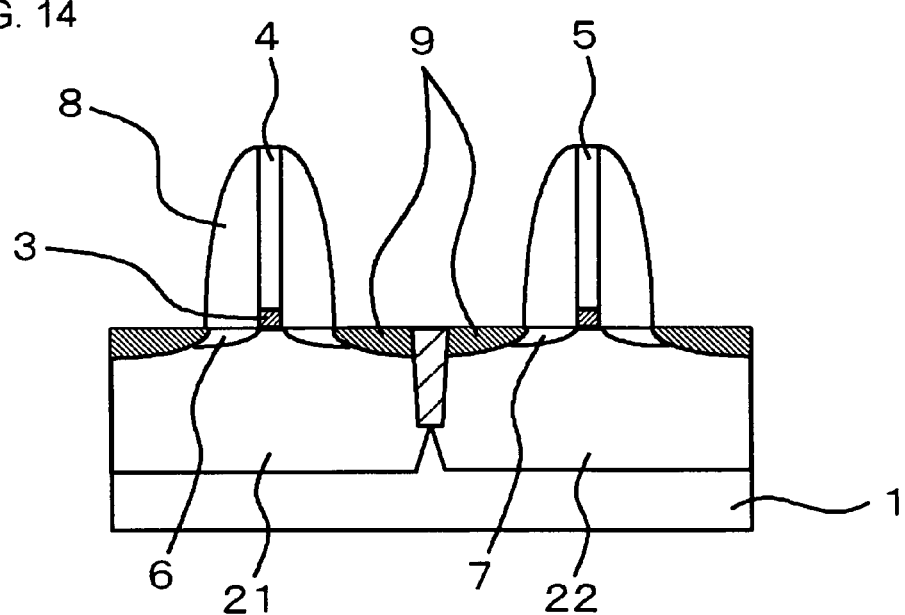
FIG. 14 is a schematic sectional view showing a sixth procedure in another modification.
Figure 15:
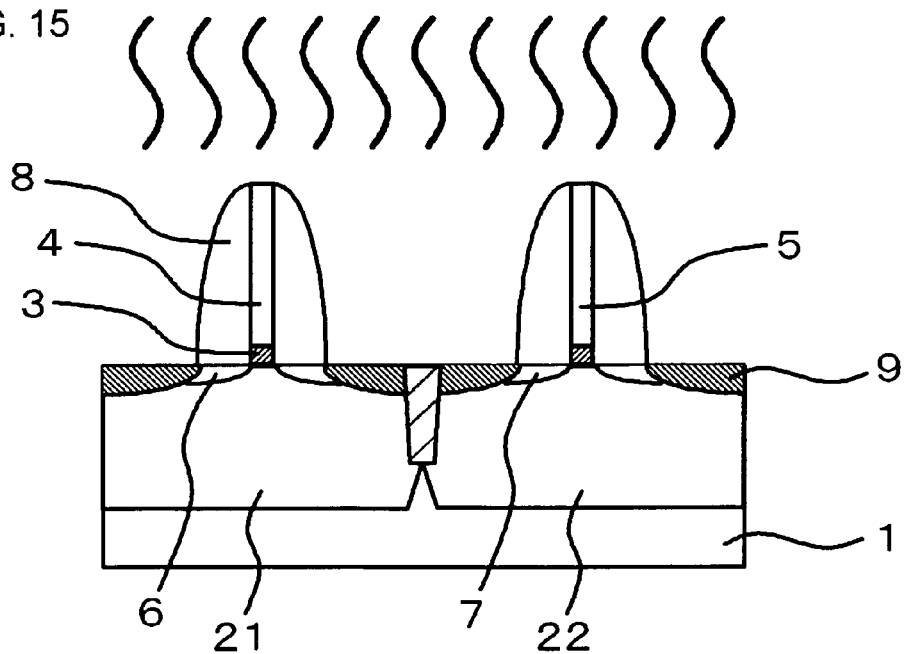
FIG. 15 is a schematic sectional view showing a seventh procedure in another modification.

On the other hand, as shown in the process flow in FIGS. 13 to 15, the process of FLA, in which a low-output waveform and a high-output waveform are combined, and the process of flash lamp annealing, in which a time for which the wafer surface temperature exceeds 1000° C. is 0.1 to 10 milliseconds, may be exchanged with each other.

Thus, even if FLA, in which a low-output waveform and a high-output waveform are combined, and the flash lamp annealing, in which a time for which the wafer surface temperature exceeds 1000° C. is 0.1 to 10 milliseconds, are combined, the same effects can be obtained from the points of 1) FLA hardly causes impurity diffusion and 2) FLA in which low and high outputs are combined also activates the non-amorphous silicon surface efficiently. In addition, by applying the present embodiment, it is possible to solve the problem that high activation and preventing wafer breaking occurring in FLA, in which the temperature of the entire wafer surface becomes high, are difficult to be compatible with each other.

Moreover, although an example where the first and second heat treatment are FLA is illustrated in the above explanation given with reference to FIGS. 1 to 15, the same effect can be obtained even if the first and second heat treatment are LA.

In addition, it is a matter of course that the above embodiment and the plurality of modifications may be combined within the range where the contents do not conflict with each other. In addition, although the structure and the like of each portion were specifically described in the above embodiment and modifications, the structure and the like may be variously changed within the range where the invention of this application is satisfied.

It is apparent that the present invention is not limited to the above embodiment, and may be modified and changed without departing from the scope and spirit of the invention.

What is claimed is:

1. A method of manufacturing a semiconductor device, the method comprising:
    performing heat treatment for activating impurities of a transistor having a gate electrode over a gate insulating film with a higher relative permittivity than a silicon oxynitride film or a silicon oxide film,
    wherein said performing heat treatment comprises:
        performing a first heat treatment, in which a wafer surface is heated at a temperature of 800 to 1000° C. in 5 to 50 milliseconds by one of low-output flash lamp annealing or laser annealing; and
        performing a second heat treatment, in which said wafer surface is heated at a temperature equal to or more than 1100° C. in 0.1 to 10 milliseconds one of by flash lamp annealing or laser annealing with a higher output than in said first heat treatment,
    wherein said second heat treatment is performed after said first heat treatment.

2. The method according to claim 1, wherein said performing said heat treatment is performed after an implantation of a source/drain extension,
    wherein a sidewall and a source/drain region are formed before said performing heat treatment, and
    wherein a third heat treatment is performed after said sidewall and said source/drain region are formed, said third heat treatment being performed by flash lamp annealing or laser annealing in which said wafer surface temperature is held at equal to or more than 1000° C. for 0.1 to 10 milliseconds.

3. The method according to claim 1, wherein a fourth heat treatment is performed after an implantation of a source/drain extension, said fourth heat treatment being performed by flash lamp annealing or laser annealing in which said wafer surface temperature is held at equal to or more than 1000° C. for 0.1 to 10 milliseconds,
    wherein a sidewall and a source/drain region are formed after said fourth heat treatment, and
    wherein said performing said heat treatment is performed after said sidewall and said source/drain region are formed.

4. The method according to claim 1, wherein a material of said gate electrode comprises at least one conductive material selected from the group consisting of Poly-Si, Ta, TaSix, TaCx, Ti, TiSix, TiCx, Hf, HfSix, HfCx, Mo, MoSix, MoCx, TaNx, W, WSix, WCx, Zr, ZrSix, ZrCx, and nitrides thereof.

5. The method according to claim 1, wherein a material of said gate insulating film comprises at least one dielectric material selected from the group consisting of SiO2, HfO2, HfSiOx, HfAlOx, ZrO2, ZrSiOx, ZrAlOx, Y2O3, La2O3, MgO2, Al2O3, and nitrides thereof.

6. The method according to claim 1, wherein said gate electrode comprises one of a polysilicon gate electrode and a metal gate electrode.

7. The method according to claim 1, wherein a sidewall and a source/drain region are formed after an implantation of a source/drain extension, and
    wherein said performing said heat treatment is performed after said sidewall and said source/drain region are formed.

* * * * *